(12) United States Patent
Chen et al.

(10) Patent No.: US 12,040,404 B2
(45) Date of Patent: Jul. 16, 2024

(54) PASSIVATION LAYER AND PREPARATION METHOD THEREOF, FLEXIBLE THIN FILM TRANSISTOR AND PREPARATION METHOD THEREOF, AND ARRAY SUBSTRATE

(71) Applicant: SOUTH CHINA UNIVERSITY OF TECHNOLOGY, Guangzhou (CN)

(72) Inventors: Rongsheng Chen, Guangzhou (CN); Lelong Yan, Guangzhou (CN); Wei Zhong, Guangzhou (CN)

(*) Notice: Subject to any disclaimer, the term of this patent is extended or adjusted under 35 U.S.C. 154(b) by 414 days.

(21) Appl. No.: 17/643,839

(22) Filed: Dec. 13, 2021

(65) Prior Publication Data

US 2022/0109073 A1  Apr. 7, 2022

(30) Foreign Application Priority Data

Dec. 29, 2020 (CN) .......................... 202011596763.9

(51) Int. Cl.
| | |
|---|---|
| H01L 29/786 | (2006.01) |
| H01L 27/12 | (2006.01) |
| H01L 29/45 | (2006.01) |
| H01L 29/66 | (2006.01) |

(52) U.S. Cl.
CPC .... *H01L 29/78606* (2013.01); *H01L 27/1225* (2013.01); *H01L 29/45* (2013.01); *H01L 29/66969* (2013.01); *H01L 29/78603* (2013.01); *H01L 29/7869* (2013.01)

(58) Field of Classification Search
None
See application file for complete search history.

(56) References Cited

U.S. PATENT DOCUMENTS

| | | |
|---|---|---|
| 2015/0115264 A1 | 4/2015 | Kato |
| 2016/0211474 A1 | 7/2016 | Matsubara |
| 2017/0154905 A1 | 6/2017 | Yuan et al. |

FOREIGN PATENT DOCUMENTS

CN        111243971 A  *  1/2020

* cited by examiner

*Primary Examiner* — Asok K Sarkar
(74) *Attorney, Agent, or Firm* — Zhigang Ma (57) ABSTRACT

The present disclosure discloses a passivation layer and a preparation method thereof, a flexible thin film transistor and a preparation method thereof, and an array substrate. The passivation layer of the present disclosure is a self-assembled monolayer formed by hydrophobic substances with a melting point of less than 100° C. The flexible thin film transistor of the present disclosure comprises a flexible substrate, a gate electrode, a gate dielectric layer, an active layer, a source-drain electrode layer and the passivation layer of the present disclosure.

5 Claims, 10 Drawing Sheets

PASSIVATION LAYER AND PREPARATION METHOD THEREOF, FLEXIBLE THIN FILM TRANSISTOR AND PREPARATION METHOD THEREOF, AND ARRAY SUBSTRATE

TECHNICAL FIELD

The present disclosure relates to the technical field of display devices, particularly to a passivation layer and a preparation method thereof, a flexible thin film transistor and a preparation method thereof, and an array substrate.

BACKGROUND

A thin film transistor (TFT) is mainly used for controlling and driving liquid crystal pixels in a liquid crystal display (LCD) and subpixels in an organic light-emitting diode (OLED), and is one of important electronic devices in the field of panel display.

As the next-generation active matrix panel display technology is being developed toward directions such as large size, ultra HD and high frame rate, people has more and more requirements on performances of thin film transistors, requiring that it must provide enough electrical driving capability. Inorganic metal oxide thin film transistors have the characteristics of low cost, low preparation temperature, high visible light transmittance, moderate electrical property, and attract increasingly attention in recent years. The amorphous indium gallium zinc oxide (a-InGaZnO) is typically used as an active layer for a bottom gate thin film transistor. However, the field effect mobility of a-IGZO TFTs in the practical use is often limited to about 10 $cm^2/V \cdot s$, which fundamentally cannot meet the requirement of high resolution display. Meanwhile, since the oxide semiconductor is extremely sensitive to exterior environments (such as water and oxygen adsorption) leading to the poor electrical stability of the oxide thin film transistor, it is necessary to arrange the passivation layer to improve the property of the devices. Thus, it is urgent to develop an inorganic metal oxide thin film transistor with high mobility and good electrical stability.

In recent years, a flexible display device is widely used for wearable devices and foldable display devices. Since most of the flexible substrates are organic polymers, they have poor capabilities of obstructing exterior environment which easily cause the electrical property of thin film transistors, especially the stability, to deteriorate. In addition, flexible substrates can bear lower processing temperature compared with the glass substrates, so a lower processing temperature is often required.

Self-assembled monolayers (SAMs) can be used as the passivation layer, and have many advantages (for example, neat molecular arrangement, little surface defects, stable thermodynamic property, chemical and physical damage resistance, and firm enough to withstand extra processes) compared with the traditional passivation layer process (for example PECVD (plasma enhanced chemical vapor deposition), PLD (pulsed laser deposition), and ALD (atomic layer deposition)).

Self-assembled deposition can be completed by using a liquid-phase method and a vapor-phase method. However, both of them have obvious defects. For the liquid-phase method, a little amount of water is easily introduced to generate copolymerization, directing to the poor passivation layer quality. In addition, TFTs need to be soaked into the solution for a long term using the liquid-phase method, which leads to poor controllability. This method has a potential to cause poor source-drain contact, and also has the phenomenon of flexibility shedding. For the vapor-phase method, the self-assembled solution is evaporated on the surface of the device. This method easily allows impurities to be mixed in the passivation layer to influence the quality of the thin film.

SUMMARY

The objective of the present disclosure is to provide a passivation layer and a preparation method thereof, a flexible thin film transistor and a preparation method thereof, and an array substrate.

The technical solution adopted by the present disclosure is as follows:

Provided is a passivation layer which is a self-assembled monolayer formed by a hydrophobic substance with a melting point of less than 100° C.; the substance with a melting point less than 100° C. is one of $C_{10}$~$C_{18}$ linear alkyl mercaptan, $C_{10}$~$C_{18}$ linear alkyl phosphonate, $C_{10}$~$C_{18}$ linear fatty acid, $C_{10}$~$C_{18}$ linear fatty amine and $C_{10}$~$C_{18}$ linear alkyl phosphate.

Preferably, a passivation layer is a self-assembled monolayer formed by a hydrophobic substance with a melting point less than 100° C.; the hydrophobic substance with a melting point less than 100° C. is one of $C_{10}$~$C_{18}$ linear alkyl mercaptan and $C_{10}$~$C_{18}$ linear fatty amine.

Further preferably, a passivation layer is one of an n-octadecyl mercaptan self-assembled monolayer and an octadecyl amine self-assembled monolayer. The melting point of n-octadecyl mercaptan is 25° C.~33° C., the melting point of octadecyl amine is 50° C.~60° C., and the treatment temperature for self-assembly through vapor deposition is low.

Preferably, the thickness of the passivation layer is 1 nm~5 nm.

Provided is a preparation method of the above passivation layer, comprising the following steps: placing a substrate where a source-drain electrode layer is prepared in a closed container, adding a hydrophobic substance with a melting point less than 100° C. into the closed container and heating to the melting point, and performing vapor deposition to form the passivation layer on the source-drain electrode layer.

Preferably, the time for vapor deposition is 8 h~12 h.

Provided is a flexible thin film transistor, comprising a flexible substrate, a gate electrode, a gate dielectric layer, an active layer and a source-drain electrode layer, wherein the surface of the source-drain electrode layer is also provided with the above passivation layer.

Preferably, a flexible thin film transistor is provided with a flexible substrate, a gate electrode, a gate dielectric layer, an active layer, a source-drain electrode layer and a passivaton layer successively laminated from bottom to top.

Preferably, the material of the flexible substrate is polyimide

Preferably, the thickness of the gate electrode is 80 nm~120 nm.

Preferably, the thickness of the gate dielectric layer is 160 nm~240 nm.

Preferably, the material of the active layer is one of indium zinc oxide, tin zinc oxide, indium tin zinc oxide, indium gallium zinc oxide and fluorine tin zinc oxide.

Preferably, the thickness of the active layer is 15 nm~25 nm.

Preferably, the source electrode in the source-drain electrode layer is one of an ITO electrode, an Al electrode, a Cu electrode and an Au electrode.

Preferably, the drain electrode in the source-drain electrode layer is one of the ITO electrode, the Al electrode, the Cu electrode and the Au electrode.

Preferably, the thickness of the source-drain electrode layer is 100 nm~140 nm.

Provided is a preparation method of the above flexible thin film transistor, comprising the following steps:
1) depositing a gate electrode, a gate dielectric layer, an active layer and a source-drain electrode layer on a flexible substrate in turn; and
2) placing a substrate where the source-drain electrode layer is prepared in a closed container, then adding n-octadecyl mercaptan or octadecyl amine into the closed container and heating to a melting point, and performing vapor deposition so as to form the passivation layer on the source-drain electrode layer, that is, the flexible thin film transistor.

Preferably, the preparation method of the above flexible thin film transistor comprises the following steps:
1) depositing a gate electrode, a gate dielectric layer, an active layer and a source-drain electrode layer on a flexible substrate in turn, patterning, and finally annealing the substrate; and
2) placing a substrate where the source-drain electrode layer is prepared in a closed container, then adding n-octadecyl mercaptan or octadecyl amine into the closed container and heating to a melting point, and performing vapor deposition so as to form the passivation layer on the source-drain electrode layer, that is, the flexible thin film transistor.

Preferably, the deposition method in step 1) is one of a magnetron sputtering method, a spin coating method and an evaporation method.

Preferably, the surface of the active layer in step 1) is subjected to at least one of UV treatment and Plasma treatment.

Preferably, the annealing in step 1) is carried out at 250° C.~350° C., the annealing atmosphere is air, and the annealing time is 2 h~5 h.

Provided is an array substrate, comprising a substrate and a thin film transistor arranged on the substrate, wherein the thin film transistor is the above flexible thin film transistor.

The present disclosure has the beneficial effects that the hydrophobic substance with a melting point of lower than 100° C. is adopted for self-assembly to form a monolayer as the passivation layer of the flexible thin film transistor, the treatment temperature in the process of self-assembly is low, the density of the formed passivation layer is high, so as to prevent the back channel of the flexible thin film transistor from direct contact with water and oxygen in the atmosphere. The electrical property and stability of the flexible thin film transistor are significantly improved.

BRIEF DESCRIPTION OF THE DRAWINGS

Reference numbers: flexible substrate 100, gate electrode 200, gate dielectric layer 300, active layer 400, source-drain electrode layer 500, source electrode 501, drain electrode 502 and passivation layer 600.

DESCRIPTION OF THE EMBODIMENTS

Next, the present disclosure will be further explained and illustrated in combination with specific embodiments.

EXAMPLES

Figure 1:
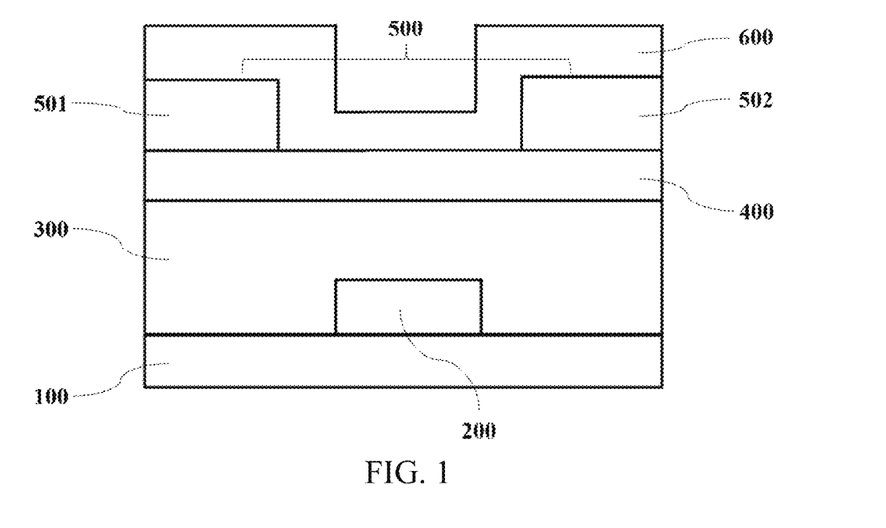
FIG. 1 is a structural diagram of a flexible thin film transistor according to the present disclosure.

A preparation method of a flexible thin film transistor (its structure is shown in FIG. 1) comprises the following steps:
1) a polyimide substrate with a thickness of 0.5 mm was selected as a flexible substrate, and ultrasonically washed for 15 min with deionized water and isopropanol respectively, then put in a thermostat to be baked for 1 h at 90° C., and then an Al—Nd alloy thin film with a thickness of 100 nm was prepared on the polyimide substrate through direct-current magnetron sputtering, and patterned through photolithography to form a gate electrode;
2) the polyimide substrate where the gate electrode was prepared and a stainless steel plate were put into an ethylene glycol solution of ammonium tartrate, the polyimide substrate was used as an anode and the stainless steel plate was used as a cathode. A constant current was applied between the anode and the cathode. A voltage between the anode and the cathode kept constant until a current between the anode and the cathode was reduced to about 0.001 mA/cm$^2$, an aluminum oxide neodymium layer with a thickness of 200 nm was formed on the surface of the Al—Nd alloy film, and the aluminum oxide neodymium layer was patterned, so as to obtain a gate dielectric layer;

3) the polyimide substrate where the gate dielectric layer was prepared was put into a patterned metal mask to be fixed. An indium tin zinc oxide film with a thickness of 20 nm was deposited as an active layer by using a method in which a polycrystalline indium tin oxide target controlled by direct-current power source magnetron sputtering and a polycrystalline zinc oxide target controlled by radio-frequency power source magnetron sputtering were simultaneously used; wherein, the power density when the polycrystalline indium tin oxide target was sputtered was about 5.4 W/cm$^2$, and a mass ratio of $In_2O_3$ to $SnO_2$ in the polycrystalline indium tin oxide target was 9:1; the power density when the polycrystalline zinc oxide target was sputtered was about 7.4 W/cm$^2$; the pressure of the sputtering chamber was set as 0.5 Pa, the used gas atmosphere was oxygen and argon, the flows were respectively set as 6 sccm and 10 sccm, the sputtering temperature was set as 30° C., and the sputtering power of the polycrystalline indium tin oxide target was set as 100 W, the sputtering power of the polycrystalline zinc oxide target was set as 130 W, and the sputtering time was set as 2 min;

4) the polyimide substrate where the active layer was prepared was placed on a temperature-adjustable hot stage, and annealed for 2 h in air at a set temperature of 350° C.;

5) the annealed polyimide substrate was put into the patterned metal mask to be fixed, and a copper film with a thickness of 100 nm was deposited as the source electrode and the drain electrode using a high-pure copper target controlled via direct-current power source magnetron sputtering. The formed electrode allows the width and length of the channel to be 300 μm, that is, a width-to-length ratio was 1:1, so that the source-drain electrode layer was formed; the pressure of the sputtering chamber was set as 0.5 Pa, and the gas atmosphere was argon, the flow was set as 10 sccm, the sputtering temperature was set as 30° C., the sputtering power of the copper target was set as 100 W, and the sputtering time was set as 3 min;

6) n-octadecanethiol was added into a tungsten boat to be pre-melted for 2 h, and then the polyimide substrate where the source-drain electrode layer was prepared was inverted on the tungsten boat, the source-drain electrode layer was not in direct contact with n-octadecane, then the tungsten boat was placed in a culture dish and sealed, the sealed culture dish was placed in a vacuum oven and maintained at 33° C. for 10 h, and a passivation layer with a thickness of 2 nm was formed on the surface of the source-drain electrode layer by self-assembly, namely, a flexible thin film transistor was obtained.

Comparative Example 1

A flexible thin film transistor, except that the passivation layer is not arranged on the surface of the source-drain electrode layer, is completely the same as that in examples.

Comparative Example 2

A flexible thin film transistor, except that the passivation layer is deposited on the surface of the source-drain electrode layer by using a liquid deposition method, is completely the same as that in examples.

The specific operations of the liquid deposition method are as follows: the 10 mmol/L n-octadecanethiol solution is added into the beaker, and then the polyimide substrate where the source-drain electrode layer is prepared is immersed into the n-octadecanethiol solution for 3 h, the beaker was sealed and heated in water bath at a water bath temperature of 70° C., then the polyimide substrate was taken out and rinsed with isopropanol, then a nitrogen stream flows across the surface of the polyimide substrate for 2 min, and subsequently the polyimide substrate was dried in an oven for 30 min at 80° C.

Performance Test

1) The morphologies of the upper surfaces of flexible thin film transistors in comparative example 1, comparative example 2 and an example (comparative example 1 was the active layer surface, and comparative example 2 and examples were the passivation layer surfaces) were observed by atomic force microscope (AFM). The obtained AFM images are shown in FIG. 2~4 in turn.

Figure 2:
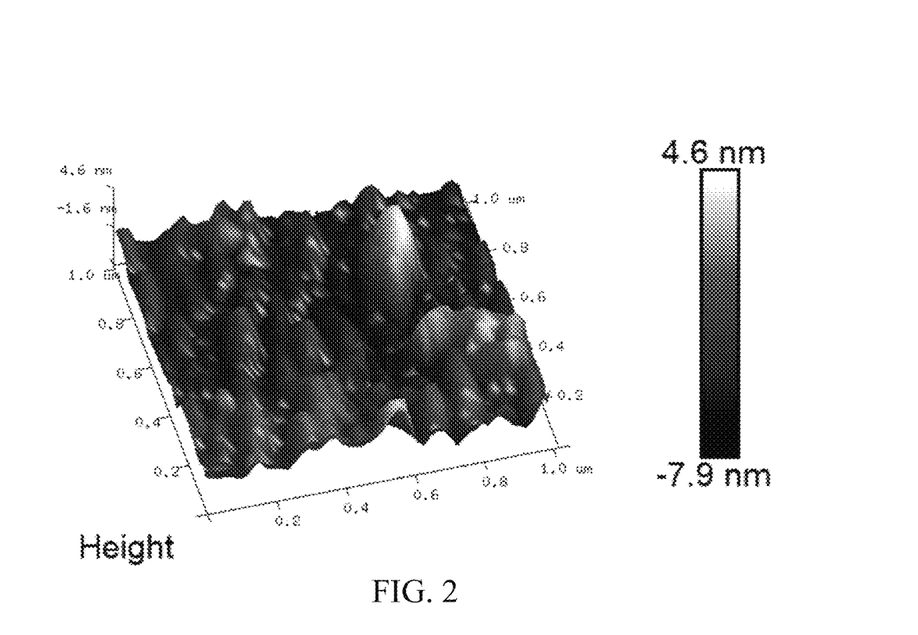
FIG. 2 is an atomic force microscope (AFM) image of an upper surface of a flexible thin film transistor in comparative example 1.
Figure 3:
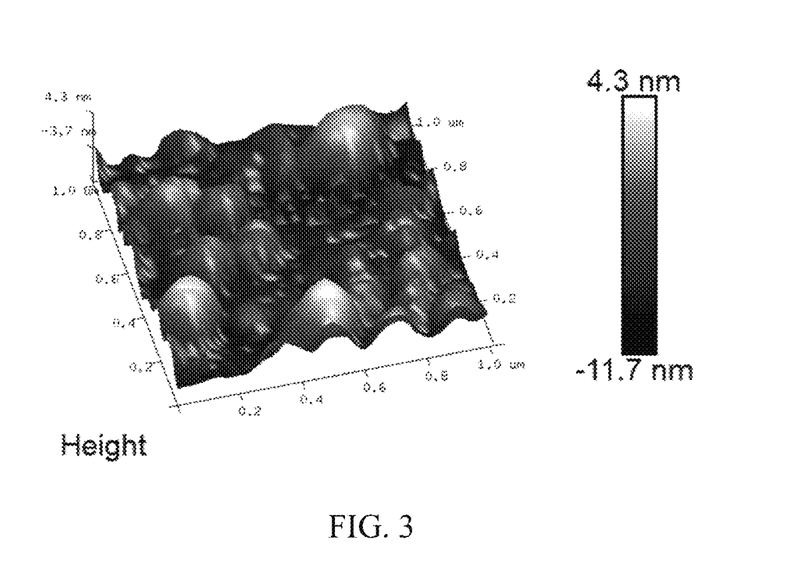
FIG. 3 is an AFM diagram of an upper surface of a flexible thin film transistor in comparative example 2.
Figure 4:
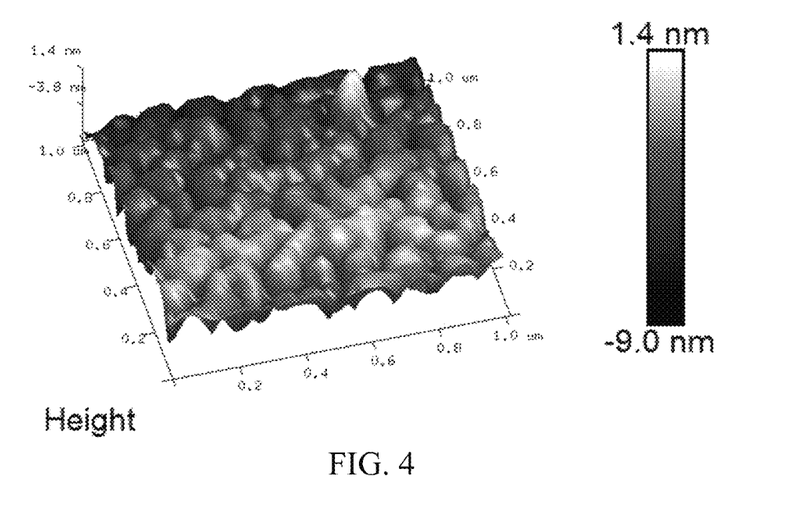
FIG. 4 is an AFM diagram of an upper surface of a flexible thin film transistor in an example.

It can be seen from FIGS. 2~4 that the upper surface of the flexible thin film transistor in the example is the smoothest, while the upper surfaces of the flexible thin film transistors in comparative example 1 and comparative example 2 are rough. The calculated RMS roughness of the flexible thin film transistors in comparative example 1, comparative example 2 and the example are 1.73 nm, 2.6 nm and 1.25 nm, respectively.

2) Through surface tension contact angle tester OCA40 Micro, a water contact angle test was carried out on the upper surfaces of the flexible thin film transistors in comparative example 1, comparative example 2 and the example (comparative example 1 is the active layer surface, and comparative example 2 and the example were the passivation layer surfaces). The contact angle images are shown in FIGS. 5~7 in turn.

Figure 5:
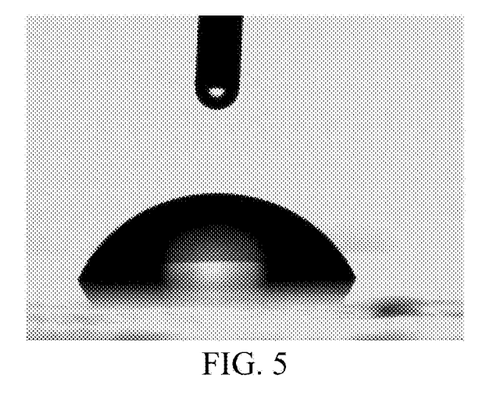
FIG. 5 is a contact angle image of an upper surface of a flexible thin film transistor in comparative example 1.
Figure 6:
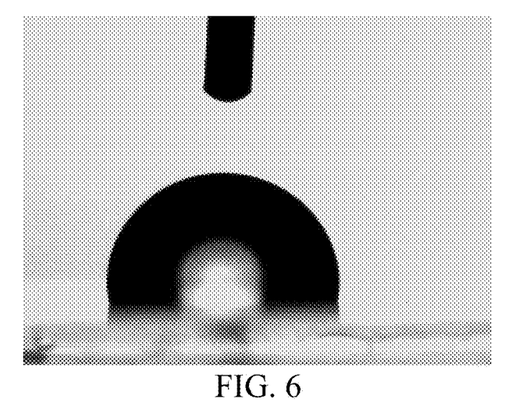
FIG. 6 is a contact angle image of an upper surface of a flexible thin film transistor in comparative example 2.
Figure 7:
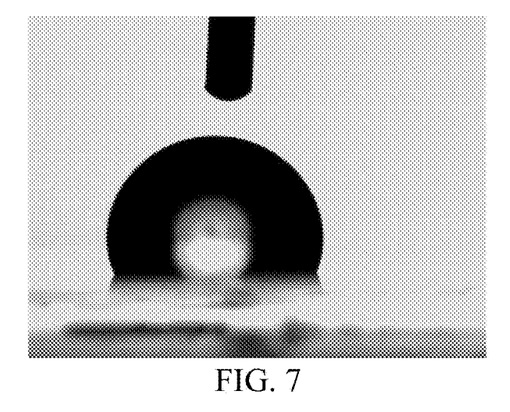
FIG. 7 is a contact angle image of an upper surface of a flexible thin film transistor in an example.

It can be seen from FIGS. 5~7 that the water contact angles of the flexible thin film transistors in comparative example 1, comparative example 2 and the example are 66.2°, 1050 and 111.9°, respectively. It can be seen that the monolayer film formed by self-assembly via a vapor deposition method can effectively modify the surface of an oxide, reduce the oxidation capacity of the surface of a metal oxide semiconductor, and decrease the phenomenon of water and oxygen adsorption and desorption, thus improving the stability of the device. At the same time, the monolayer formed by self-assembly can fill the dangling bonds and some structural defects on the oxide semiconductor, so as to improve the mobility of carriers and reduce the adsorption of water and oxygen by the flexible substrate. In addition, the self-assembly effect of the vapor deposition method is more obvious and stable than that of the liquid deposition method.

3) The electrical properties and stabilities of the flexible thin film transistors in comparative example 1, comparative example 2 and the example were measured by Agilent 4155C semiconductor parameter analyzer. The obtained transfer curves and hysteresis curves are shown in FIG. 8 and FIG. 9, respectively.

Figure 8:
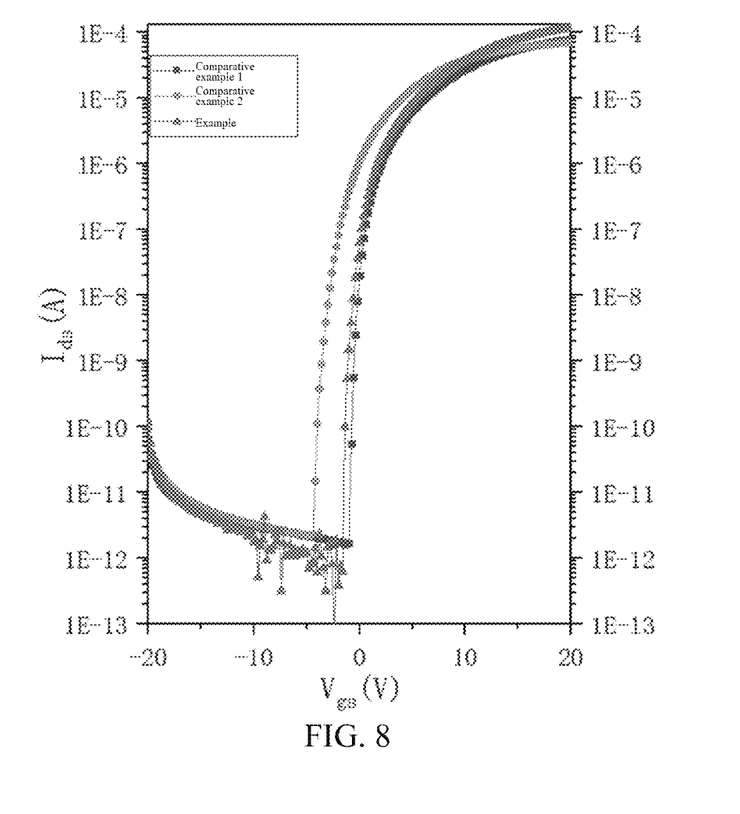
FIG. 8 shows transfer curves of flexible thin film transistors in comparative example 1, comparative example 2 and an example.

As can be seen from FIG. 8, the flexible thin film transistor in the example has the best electrochemical property, a field effect mobility up to 22.5 cm$^2$/V·s, the subthreshold swing as low as 0.09V/decade, and a switching current ratio more than 109. The flexible thin film transistor in comparative example 1 has the field effect mobility of only 16.5 cm$^2$/V·s, a subthreshold swing of 0.13V/decade, and a switching current ratio of only 4×10$^7$. It can be seen that the monolayer formed by self-assembly via the vapor deposition method has high carrier mobility and less defect states, and a high-quality interface is obtained.

Figure 9:
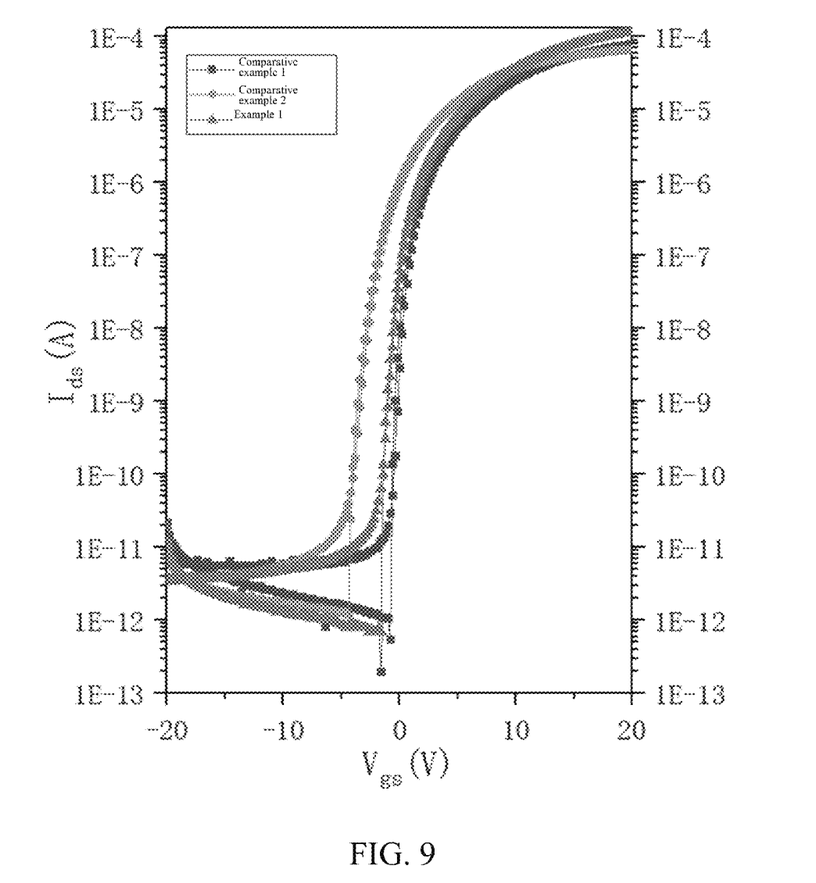
FIG. 9 shows hysteresis curves of flexible thin film transistors in comparative example 1, comparative example 2 and an example.

It can be seen from FIG. 9 that the hysteresis of the flexible thin film transistor in comparative example 2 and the hysteresis of the flexible thin film transistor in the example are both less than the hysteresis of the flexible thin film transistor in comparative example 1, and the hysteresis of the flexible thin film transistor in the example is the smallest, which is less than 0.1V, indicating that the flexible thin film transistor in the example has the fewest defects, and the effect of the vapor deposition method is better than that of the liquid deposition method.

3) The output performances of the flexible thin film transistors in comparative example 1 and comparative example 2 were measured by Agilent 4155C semiconductor parameter analyzer. The output curves are shown in FIGS. 10 and 11 in turn.

Figure 10:
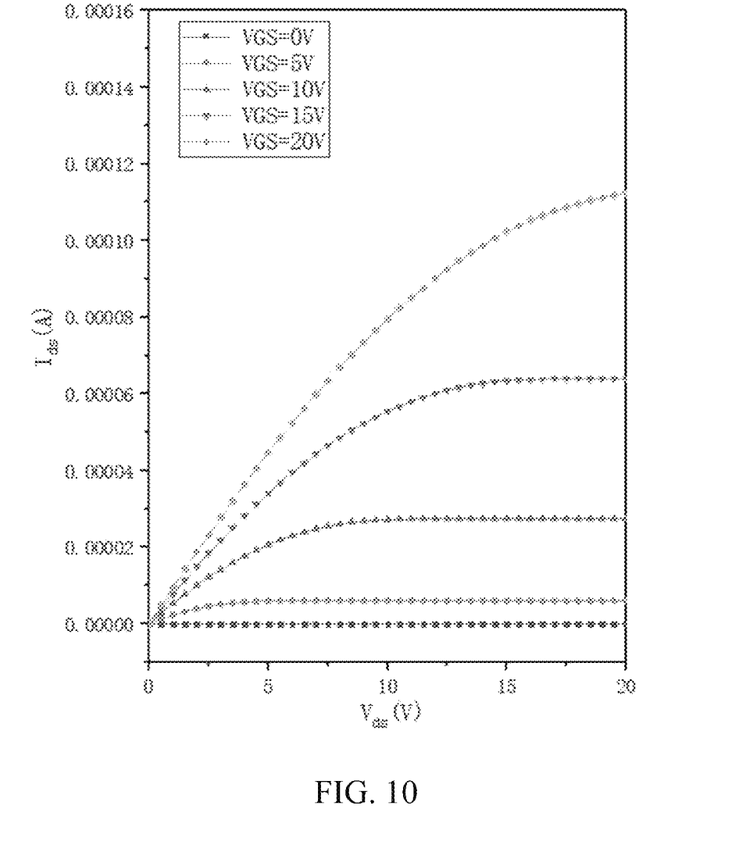
FIG. 10 shows an output curve of a flexible thin film transistor in comparative example 1.
Figure 11:
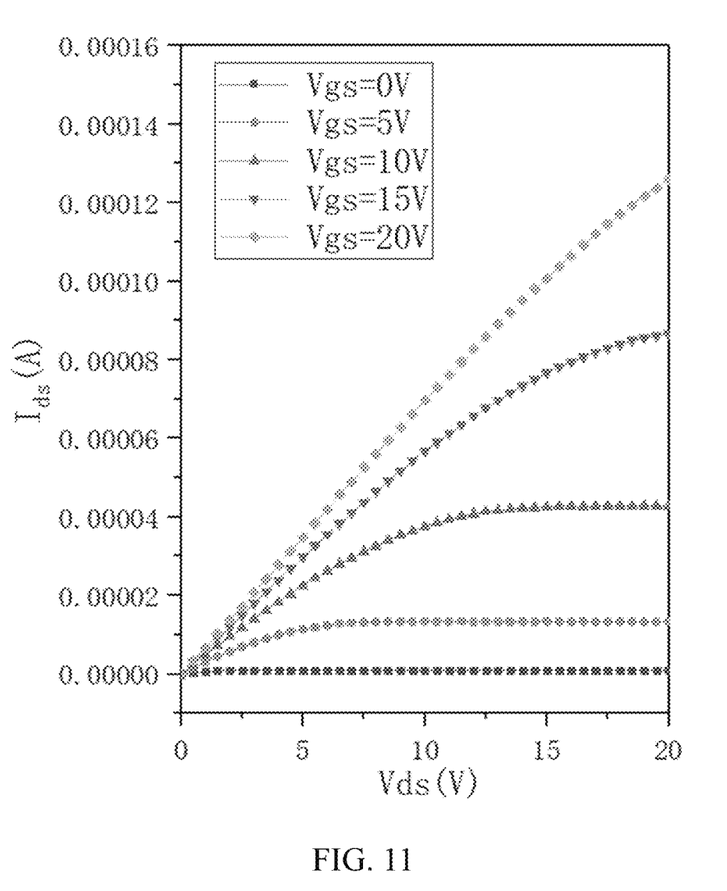
FIG. 11 shows an output curve of a flexible thin film transistor in comparative example 2.

It can be seen from FIG. 10 and FIG. 11 that there is a current crowding effect in the flexible thin film transistor treated by the liquid deposition method, and ohmic contact is poor, indicating that the probability that the contact between the source-drain electrode layer and the active layer is worsen will increase when the device is immersed into the solution for a long term.

Figure 12:
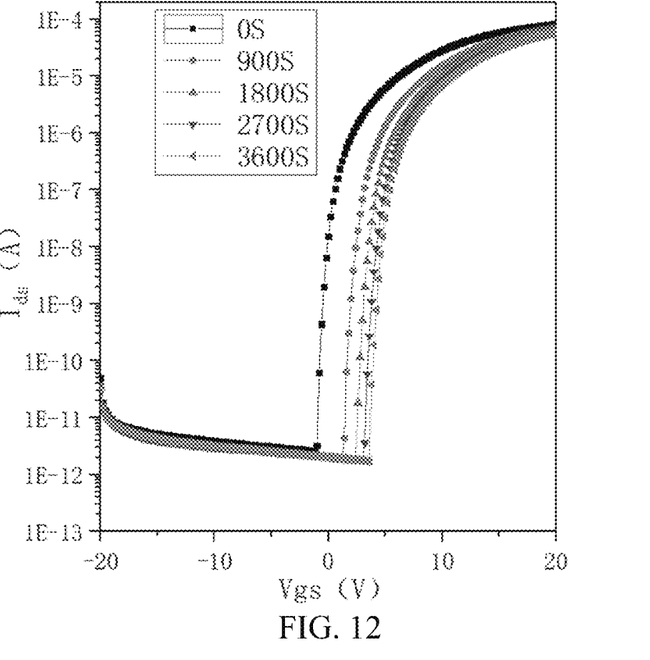
FIG. 12 shows a transfer curve of a flexible thin film transistor in comparative example 1 after a positive gate bias stress is applied.
Figure 13:
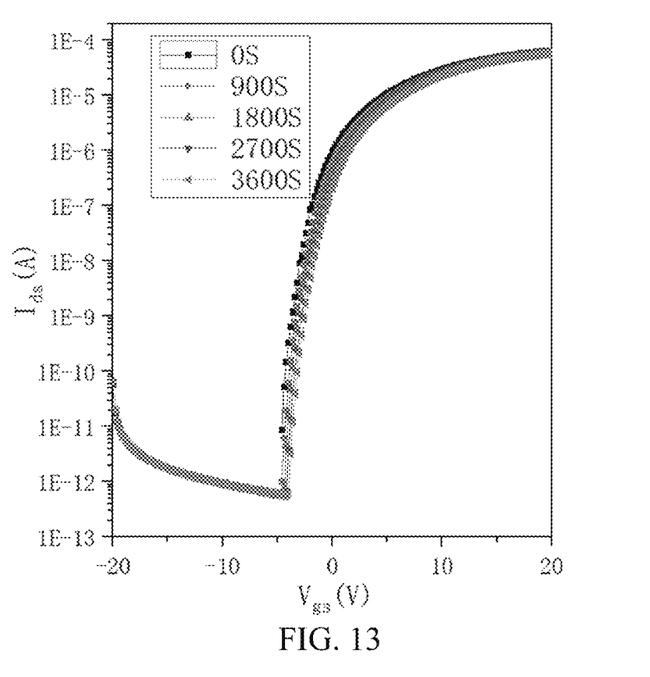
FIG. 13 shows a transfer curve of a flexible thin film transistor in comparative example 2 after a positive gate bias stress is applied.
Figure 14:
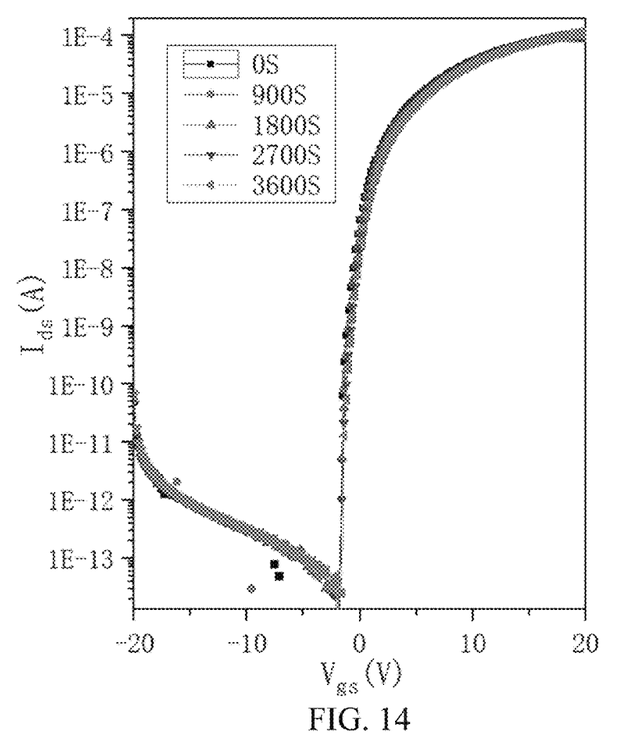
FIG. 14 shows a transfer curve of a flexible thin film transistor in an example after a positive gate bias stress is applied.
Figure 15:
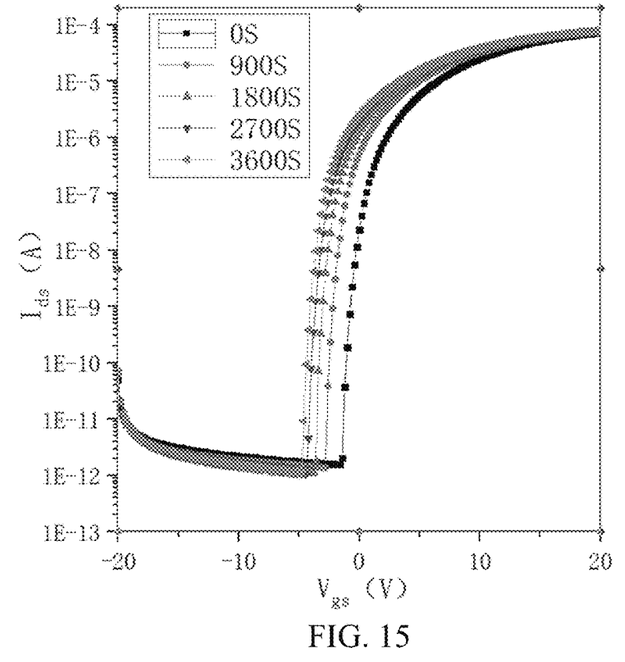
FIG. 15 shows a transfer curve of a flexible thin film transistor in an example 1 after a negative gate bias stress is applied.
Figure 16:
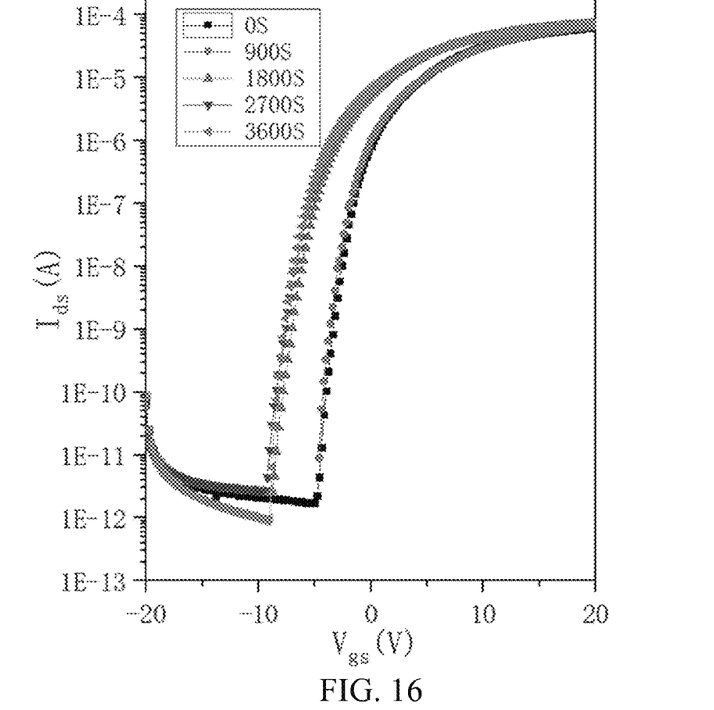
FIG. 16 shows a transfer curve of a flexible thin film transistor in comparative example 2 after a negative gate bias stress is applied.
Figure 17:
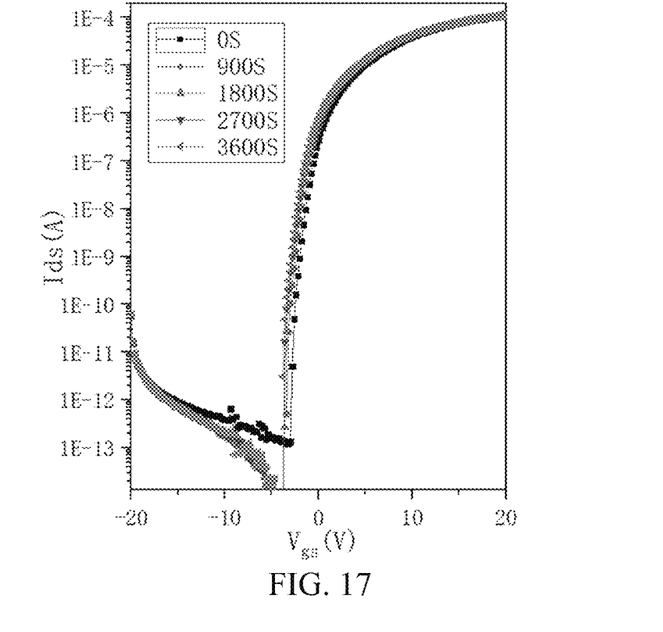
FIG. 17 shows a transfer curve of a flexible thin film transistor in an example after a negative gate bias stress is applied.

4) The electrical properties and stabilities of the flexible thin film transistors in comparative example 1, comparative example 2 and the example after positive gate bias stress and negative gate bias stress were applied were measured in air with a relative humidity of 60%. The transfer curve of the flexible thin film transistor in comparative example 1 after the positive gate bias stress is applied is shown in FIG. 12. The transfer curve of the flexible thin film transistor in comparative example 2 after the positive gate bias stress is applied is shown in FIG. 13. The transfer curve of the flexible thin film transistor in the example after the positive gate bias stress is applied is shown in FIG. 14. The transfer curve of the flexible thin film transistor in comparative example 1 after the negative gate bias stress is applied is shown in FIG. 15. The transfer curve of the flexible thin film transistor in comparative example 2 after the negative gate bias stress is applied is shown in FIG. 16. The transfer curve of the flexible thin film transistor in the example after the negative gate bias stress is applied is shown in FIG. 17.

It can be seen from FIG. 12 that the threshold voltage of the flexible thin film transistor in comparative example 1 after the positive gate bias stress is applied is positively shifted by 4.9V.

It can be seen from FIG. 13 that the threshold voltage of the flexible thin film transistor in comparative example 2 after the positive gate bias stress is applied is positively shifted by 1.4V.

It can be seen from FIG. 14 that the threshold voltage of the flexible thin film transistor in the example after the positive gate bias stress is applied is positively shifted by 0.5V.

It can be seen from FIG. 15 that the threshold voltage of the flexible thin film transistor in comparative example 1 after the negative gate bias stress is applied is negatively shifted by 3.4V.

It can be seen from FIG. 16 that the threshold voltage of the flexible thin film transistor in comparative example 2 after the negative gate bias stress is applied is negatively shifted by 4V.

It can be seen from FIG. 17 that the threshold voltage of the flexible thin film transistor in the example after the negative gate bias stress is applied is negatively shifted by 0.9V.

In summary, the positive drifting and the negative shifting of the threshold voltage of the flexible thin film transistor in the example are both minimum, indicating that compared with the liquid deposition method, the self-assembled monolayer formed by the vapor deposition method, as the passivation layer, improves the bias stress stability of the flexible substrate metal oxide thin film transistor to the greatest extent.

The above example is a preferred embodiment of the present disclosure, but the embodiments of the present disclosure are not limited to the above example, any other changes, modifications, substitutions, combinations and simplifications made without departing from the spiritual essence and principle of the present disclosure should be equivalent replacement modes, which shall be included within the protective scope of the present disclosure.

What is claimed is:

1. A flexible thin film transistor, comprising a flexible substrate, a gate electrode, a gate dielectric layer, an active layer and a source-drain electrode layer, wherein the surface of the source-drain electrode layer is further provided with a passivation layer; the passivation layer is one of an n-octadecyl mercaptan self-assembled monolayer and an octadecylamine self-assembled monolayer; the thickness of the passivation layer is 1 nm~5 nm; the preparation method of the passivation layer comprises the following steps: a substrate where the source-drain electrode layer is prepared is placed in a closed container, n-octadecyl mercaptan or octadecyl amine is then added into the closed container and heated to a melting point, vapor deposition is carried out so as to form the passivation layer on the source-drain electrode layer.

2. The flexible thin film transistor according to claim 1, wherein the material of the flexible substrate is polyimide.

3. The flexible thin film transistor according to claim 1, wherein the source electrode in the source-drain electrode layer is one of an indium tin oxide (ITO) electrode, a Al electrode, a Cu electrode and a Au electrode; the drain electrode in the source-drain electrode layer is one of the ITO electrode, the Al electrode, the Cu electrode and the Au electrode.

4. A preparation method of a flexible thin film transistor according to claim 1, comprising the following steps:
Step 1: depositing a gate electrode, a gate dielectric layer, an active layer and a source-drain electrode layer on a flexible substrate in turn; and
Step 2: placing a substrate where a source-drain electrode layer is prepared in a closed container, then adding n-octadecyl mercaptan or octadecyl amine into the closed container and heating to a melting point, and performing vapor deposition so as to form a passivation layer on the source-drain electrode layer, that is, the flexible thin film transistor.

5. An array substrate, comprising a substrate and a thin film transistor arranged on the substrate, wherein the thin film transistor is the flexible thin film transistor according to claim 1.

* * * * *